(12) United States Patent
Zhang et al.

(10) Patent No.: US 11,404,448 B2
(45) Date of Patent: Aug. 2, 2022

(54) DISPLAY SUBSTRATE, MANUFACTURING METHOD THEREOF, AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Bo Zhang, Beijing (CN); Jingni Wang, Beijing (CN); Kun Guo, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 532 days.

(21) Appl. No.: 16/466,709

(22) PCT Filed: Nov. 12, 2018

(86) PCT No.: PCT/CN2018/115070
§ 371 (c)(1),
(2) Date: Jun. 5, 2019

(87) PCT Pub. No.: WO2019/196404
PCT Pub. Date: Oct. 17, 2019

(65) Prior Publication Data
US 2021/0358957 A1    Nov. 18, 2021

(30) Foreign Application Priority Data
Apr. 10, 2018   (CN) .......................... 201810315199.5

(51) Int. Cl.
*H01L 27/12* (2006.01)
*G06F 3/041* (2006.01)

(52) U.S. Cl.
CPC ........ *H01L 27/124* (2013.01); *G06F 3/04164* (2019.05); *H01L 27/1218* (2013.01);
(Continued)

(58) Field of Classification Search
CPC .. H01L 27/124–1244; H01L 33/0004–33/648; H01L 2224/3003; H01L 2224/30051; H01L 2224/301–30183
See application file for complete search history.

(56) References Cited

U.S. PATENT DOCUMENTS

| | | | |
|---|---|---|---|
| 8,436,350 B2* | 5/2013 | Yamazaki | H01L 27/1225 257/43 |
| 2014/0159255 A1* | 6/2014 | Li | H01L 23/3192 257/782 |

(Continued)

FOREIGN PATENT DOCUMENTS

| | | |
|---|---|---|
| CN | 101794822 A | 8/2010 |
| CN | 103094307 A | 5/2013 |

(Continued)

OTHER PUBLICATIONS

International Search Report and Written Opinion in corresponding International Patent Application No. PCT/CN2018/115070 dated Jan. 30, 2019 (an English translation attached hereto). 19 pages.

*Primary Examiner* — Amar Movva
(74) *Attorney, Agent, or Firm* — Leason Ellis LLP

(57) ABSTRACT

A display substrate, a manufacturing method thereof, and a display device are disclosed. The display substrate includes: a base substrate, the base substrate includes a bonding region; and a connection terminal located in the bonding region of the base substrate, the connection terminal includes a first conductive layer and a second conductive layer being in contact with each other, the first conductive (Continued)

layer and the second conductive layer are overlapped with each other in a direction perpendicular to the base substrate.

16 Claims, 3 Drawing Sheets

(52) U.S. Cl.
CPC ............... *G06F 2203/04103* (2013.01); *H01L 2224/3003* (2013.01); *H01L 2224/30051* (2013.01)

(56) References Cited

U.S. PATENT DOCUMENTS

| | | | |
|---|---|---|---|
| 2017/0271415 A1* | 9/2017 | Yamazaki | ........... H01L 27/3213 |
| 2019/0235682 A1 | 8/2019 | Choi et al. | |

FOREIGN PATENT DOCUMENTS

| | | | |
|---|---|---|---|
| CN | 107180848 A | 9/2017 | |
| CN | 108511498 A | 9/2018 | |
| CN | 208284480 U | 12/2018 | |

* cited by examiner

DISPLAY SUBSTRATE, MANUFACTURING METHOD THEREOF, AND DISPLAY DEVICE

CROSS-REFERENCE TO RELATED PATENT APPLICATIONS

The present application is a U.S. National Stage Application under 35 U.S.C. § 371 of International Patent Application No. PCT/CN2018/115070, filed Nov. 12, 2018, which claims priority of China Patent application No. 201810315199.5 filed on Apr. 10, 2018, both of which are incorporated by reference in their entireties herein.

TECHNICAL FIELD

Embodiments of the present disclosure relate to a display substrate, a manufacturing method thereof and a display device.

BACKGROUND

A display substrate in a display device has a bonding region. A display panel and a flexible printed circuit board (FPCB) are assembled with each other and conducted by using anisotropic conductive adhesive according to a certain working flow, and are connected with a structure such as a control IC. In this way, input and control of signals in the display device can be realized.

However, at present, the display substrate, the manufacturing method thereof and the display device still need to be improved.

SUMMARY

An embodiment of the present disclosure provides a display substrate, including:
a base substrate, the base substrate including a bonding region; and
a connection terminal located in the bonding region of the base substrate, the connection terminal including a first conductive layer and a second conductive layer being in contact with each other. The first conductive layer and the second conductive layer are overlapped with each other in a direction perpendicular to the base substrate.

In an example, an orthographic projection of the first conductive layer on the base substrate and an orthographic projection of the second conductive layer on the base substrate are different in at least one of shape and size.

In an example, the first conductive layer is located on a side of the second conductive layer away from the base substrate; an orthographic projection of the first conductive layer on the base substrate is smaller than an orthographic projection of the second conductive layer on the base substrate; and the orthographic projection of the first conductive layer on the base substrate is completely located within the orthographic projection of the second conductive layer on the base substrate.

In an example, the base substrate further includes a display region which is not overlapped with the bonding region; a thin film transistor and a pixel electrode are located in the display region; and the thin film transistor includes a gate electrode and a source-drain electrode.

In an example, the first conductive layer is electrically connected with the thin film transistor; and the second conductive layer is electrically connected only with the first conductive layer.

In an example, the second conductive layer and the gate electrode are located in a same layer and made of a same material; and the first conductive layer and the source-drain electrode are located in a same layer and made of a same material.

In an example, the second conductive layer and the pixel electrode are located in a same layer and made of a same material; and the first conductive layer and the source-drain electrode are located in a same layer and made of a same material.

In an example, the second conductive layer and a touch electrode are located in a same layer and made of a same material; and the first conductive layer and the source-drain electrode are located in a same layer and made of a same material.

In an example, at least one of the first conductive layer and the second conductive layer includes a plurality of sub-conductive layers.

In an example, the first conductive layer includes a stacked layer of Ti/Al/Ti; and the second conductive layer includes at least one of molybdenum and indium tin oxide.

In an example, the connection terminal is configured to be electrically connected with a circuit board.

Another embodiment of the present disclosure provides a display device, including:
the display substrate according to any one of the above-mentioned examples;
a circuit board including a metal terminal; and
a conductive film connecting the metal terminal and the connection terminal.

Yet another embodiment of the present disclosure provides a manufacturing method of the abovementioned display substrate, including:
providing the base substrate; and
providing the connection terminal in the bonding region of the base substrate.

In an example, the base substrate further includes a display region which is not overlapped with the bonding region; a thin film transistor and a pixel electrode are located in the display region; and the thin film transistor includes a gate electrode and a source-drain electrode.

In an example, providing the connection terminal in the bonding region of the base substrate includes:
synchronously providing the second conductive layer and the gate electrode of the thin film transistor on the base substrate by using a first patterning process; and
synchronously providing the first conductive layer and the source-drain electrode of the thin film transistor on a side of the second conductive layer away from the base substrate by using a second patterning process.

In an example, providing the connection terminal in the bonding region of the base substrate includes:
synchronously providing the first conductive layer and the source-drain electrode of the thin film transistor on the base substrate by using a second patterning process; and
synchronously providing the second conductive layer and the pixel electrode on a side of the first conductive layer away from the base substrate by using a first patterning process.

In an example, the display substrate further includes a touch electrode located on the base substrate,
providing the connection terminal in the bonding region of the base substrate includes:

synchronously providing the first conductive layer and the source-drain electrode of the thin film transistor on the base substrate by using a second patterning process; and synchronously providing the second conductive layer and the touch electrode on a side of the first conductive layer away from the base substrate by using a first patterning process.

In this way, the display quality can be improved, the manufacturing processes can be simplified, and the costs can be saved.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

The above and/or additional aspect(s) and advantage(s) of the present disclosure will become apparent and readily understandable from the description of the embodiments with reference to the accompanying drawings, in which.

DETAILED DESCRIPTION

Figure 1:
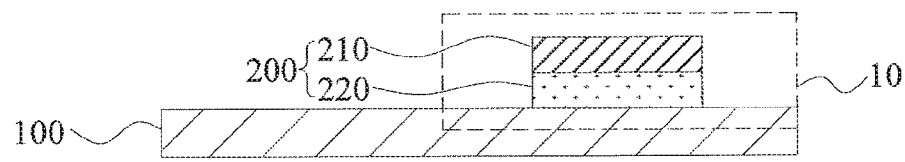
FIG. 1 is a structural diagram illustrating a display substrate according to an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Hereinafter, embodiments of the present disclosure will be described in more details. Examples of the embodiments are illustrated in the accompanying drawings, in which the same or similar reference numerals refer to the same or similar elements or elements having the same or similar functions, throughout. The embodiments described below with reference to the accompanying drawings are exemplary and are only for the purpose of explaining the present disclosure without constituting any limitation to the present disclosure.

In a display device with a flexible printed circuit board, connection terminals on a display substrate (e.g., an array substrate or a backboard of OLED) connected with the flexible printed circuit board are easy to be damaged, which may affect the performance of the display device. For example, when cutting a glass substrate above the connection terminals in a bonding region of the display substrate, it is liable to scratch the connection terminals below the glass substrate. Or, in a detection stage, a probe in a detection equipment is liable to scratch or burn out the exposed connection terminals. Moreover, it is also liable to scratch the connection terminals during a module process or during a transportation process of the display substrate. Additionally, scratched or burnt-out connection terminals will make signals in a control unit connected with the connection terminals unable to be input into the displayer through the connection terminals, thereby resulting in abnormal display on the display screen and a problem of poor display quality.

The display substrate, the manufacturing method thereof and the display device provided by the embodiments of the present disclosure can alleviate or solve at least one of the above-mentioned problems at least to some extent.

One aspect of the present disclosure provides a display substrate. According to an embodiment of the present disclosure, referring to FIG. 1, the display substrate includes a base substrate 100 and a connection terminal 200. The base substrate 100 includes a bonding region 10, and the connection terminal 200 is disposed on the bonding region 10 of the base substrate 100. The connection terminal 200 includes a first metal 210 and a sacrificial metal 220 which are stacked one on another and are in contact with each other. Herein, the first metal 210 is an example of a first conductive layer, and the sacrificial metal 220 is an example of a second conductive layer. The connection terminal in the bonding region of the display substrate has two metal layers; in this way, when the upper one of the two metal layers is scratched or burnt-out, the lower one of the two metal layers can be used for conduction, so as to avoid the problem that signals cannot be conducted due to the scratched or burnt-out, upper one of the two metal layers, thereby improving the production yield of the display substrate and improving the display quality of the display device employing the display substrate.

For ease of understanding, a display substrate in the related art will be briefly described below.

Figure 2:
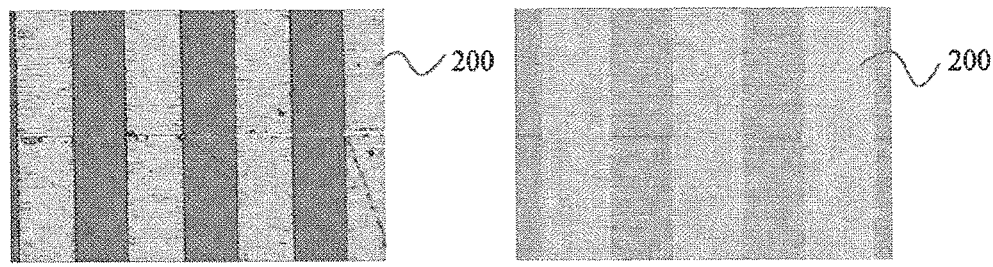
FIG. 2 is an electron microscope photograph illustrating scratches of connection terminals in a bonding region of a display substrate in the related art.
Figure 3:
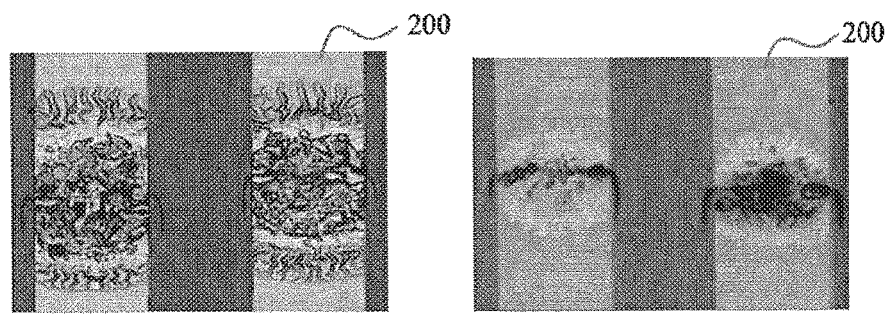
FIG. 3 is an electron microscope photograph illustrating burn-out of connection terminals in a bonding region of a display substrate in the related art.

In the related art, a connection terminal in a bonding region of a display substrate is composed of a single metal layer, and it is easy to be scratched or burnt out during a cutting process, a detection stage, a module process, or a transportation process of the display substrate. Furthermore, scratched or burnt-out connection terminals will make signals in a control unit connected with the connection terminals unable to be input into the displayer through the connection terminal, which may cause abnormal display on the display screen and result in the problem of poor display quality. An example of the connection terminal being scratched may refer to FIG. 2, in which the left figure is a picture of a front surface of the connection terminal 200 with many scratches, and the right figure is a picture of a rear surface of the connection terminal 200 with ignorable scratches. Although the connection terminal is not broken by scratching, the scratches will affect the connection between the connection terminal and the flexible printed circuit board in a subsequent process, resulting in poor contact and other problems. An example of the connection terminal being burnt out may refer to FIG. 3, in which the left figure is a picture of a front surface of the connection terminal 200 with a burnt area, and the right figure is a picture of a rear surface of the connection terminal 200 with a burnt area at a position corresponding to that of the front surface. The connection terminal 200 is burnt-out, and the signal cannot be conducted. At present, solutions for alleviating the abovementioned problems are mainly improvements in operation methods, for example, improvements in cutting method, but the improvements in operation methods cannot fundamentally solve the abovementioned problems.

According to the embodiments of the present disclosure, a structure of the connection terminal in the bonding region of the display substrate is improved in that: the connection terminal includes two metal layers, when the upper one of the two metal layers is scratched or burnt out, the lower one of the two metal layers can be used for conduction, so that the problem that signals cannot be conducted due to the scratched or burnt-out upper one of the two metal layers can be avoided; in this way, the production yield of the display substrate can be increased, and the display quality of the display device employing the display substrate can be improved.

Hereinafter, structures of the display substrate according to the embodiments of the present disclosure will be described in more details.

According to an embodiment of the present disclosure, the connection terminal 200 includes a first metal 210 and a sacrificial metal 220. A positional relationship between the first metal and the sacrificial metal is not particularly limited, as long as the first metal and the sacrificial metal are stacked one on another and are in contact with each other. For example, according to an embodiment of the present disclosure, referring to FIG. 4, a sacrificial metal 220 is disposed on the base substrate 100, and a first metal 210 is disposed on a side of the sacrificial metal 220 away from the base substrate 100. Therefore, in the case where the first metal is scratched or burnt out, signals can still be transmitted through the sacrificial metal at a breakpoint. According to some other embodiments of the present disclosure, referring to FIG. 5, a first metal 210 is disposed on the base substrate 100, and a sacrificial metal 220 is disposed on a side of the first metal 210 away from the base substrate 100. Therefore, the sacrificial metal can be used to protect the first metal, so as to avoid scratches or burn-out of the first metal, and ensure signal conduction. According to an embodiment of the present disclosure, the first metal 210 is connected with a thin film transistor, and the sacrificial metal 220 is an island structure. For example, the sacrificial metal 220 is only electrically connected with the first metal 210, and is not electrically connected with any other conductive components. That is to say, whether the first metal is disposed above or below the sacrificial metal, the display substrate transmits an input signal to the thin film transistor through the first metal, and the sacrificial metal is only used as a transitional structure when the first metal is scratched or burnt out, or the sacrificial metal is only used as a protective layer of the first metal to avoid adverse influence on the transmission of electrical signals due to the scratches or burn-out of the first metal.

In an example, an orthographic projection of the sacrificial metal 220 on the base substrate 100 is different from an orthographic projection of the sacrificial metal 220 on the base substrate 100 in at least one of shape and size.

According to an embodiment of the present disclosure, in the case where the sacrificial metal 220 is disposed on the base substrate 100 and the first metal 210 is disposed on a side of the sacrificial metal 220 away from the base substrate 100, an orthographic projection of the first metal 210 on the base substrate 100 is smaller than an orthographic projection of the sacrificial metal 220 on the base substrate 100. Further, the orthographic projection of the first metal 210 on the base substrate 100 completely falls within the orthographic projection of the sacrificial metal 220 on the base substrate 100. That is, the orthographic projection of the first metal 210 on the base substrate 100 does not exceed edges of the orthographic projection of the sacrificial metal 220 on the base substrate 100. As a result, when the first metal is scratched or burnt out at any position(s), it can be ensured that the signals can still be transmitted through the sacrificial metal at the breakpoint(s). Alternatively, in the case where the first metal 210 is disposed on the base substrate 100 and the sacrificial metal 220 is disposed on a side of the first metal 210 away from the base substrate 100, the orthographic projection of the sacrificial metal 220 on the base substrate 100 is completely smaller than the orthographic projection of the first metal 210 on the base substrate 100. The orthographic projection of the sacrificial metal 220 on the base substrate 100 completely falls within the orthographic projection of the first metal 210 on the base substrate 100. In other words, the orthographic projection of the sacrificial metal 220 on the base substrate 100 does not exceed edges of the orthographic projection of the first metal 210 on the base substrate 100. As a result, when any part of the sacrificial metal is scratched or burnt out, it still can be ensured that signals can be transmitted through the first metal.

Specific materials of the first metal and the sacrificial metal are not particularly limited, as long as the first metal and the sacrificial metal have good electrical conductivity. For example, according to an embodiment of the present disclosure, the sacrificial metal may include at least one of molybdenum (Mo) and indium tin oxide (ITO), and the first metal may include three sub-conductive layers; for example, the first metal includes titanium/aluminum/titanium (Ti/Al/Ti). Therefore, the sacrificial metal and the first metal can be formed by using known materials, so as to save the costs.

It should be noted that, titanium/aluminum/titanium (Ti/Al/Ti) refers to a stack of layers of these three metals, namely a titanium metal layer, an aluminum metal layer and a titanium metal layer, in which an aluminum metal layer is coated on a first titanium metal layer, and a second titanium metal layer is coated on a side of the aluminum metal layer away from the first titanium metal layer.

According to an embodiment of the present disclosure, in the case where the sacrificial metal 220 is disposed on the base substrate 100, the first metal 210 is disposed on a side of the sacrificial metal 220 away from the base substrate 100. The first titanium metal layer in the first metal 210 is disposed on a side of the sacrificial metal 220 away from the base substrate 100, the aluminum metal layer in the first metal 210 is disposed on a side of the first titanium metal layer away from the sacrificial metal 220, and the second titanium metal layer in the first metal 210 is disposed on a side of the aluminum metal away from the first titanium metal layer. According to an embodiment of the present disclosure, in the case where the first metal 210 is disposed on the base substrate 100 and the sacrificial metal 220 is disposed on a side of the first metal 210 away from the base substrate 100, the first titanium metal layer in the first metal 210 is disposed on the base substrate 100, the aluminum metal layer in the first metal 210 is disposed on a side of the first titanium metal layer away from the base substrate 100, the second titanium metal layer in the first metal 210 is disposed on a side of the aluminum metal layer away from the first titanium metal layer, and the sacrificial metal 220 is disposed on a side of the second titanium metal layer away from the aluminum metal layer.

Figure 4:
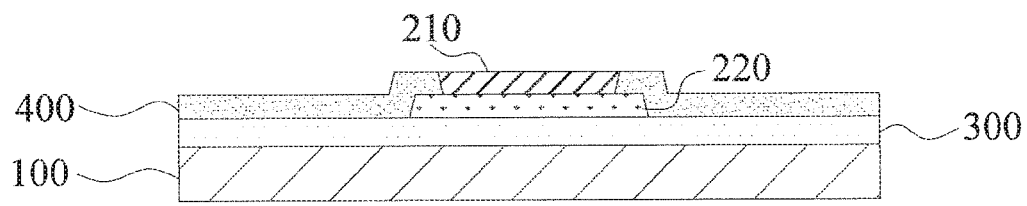
FIG. 4 is a structural diagram illustrating a display substrate according to an embodiment of the present disclosure.
Figure 5:
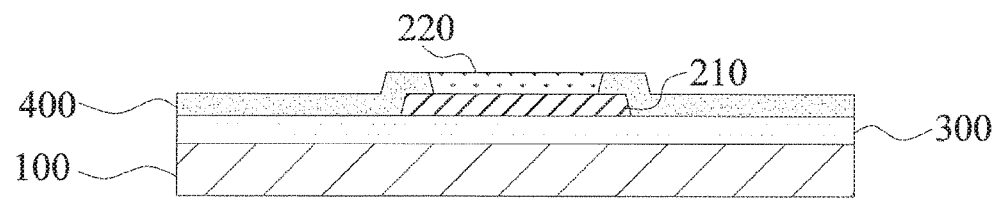
FIG. 5 is a structural diagram illustrating a display substrate according to another embodiment of the present disclosure.

According to an embodiment of the present disclosure, referring to FIGS. 4 and 5, the display substrate may further include a buffer layer 300 and a gate insulating layer 400; the buffer layer 300 is disposed between the sacrificial metal 220 and the base substrate 100 (as shown in FIG. 4), or the buffer layer 300 is disposed between the first metal 210 and the base substrate 100 (as shown in FIG. 5); the gate insulating layer 400 is disposed on a side of the buffer layer 300 away from the base substrate 100. An arrangement of the buffer layer can increase a bonding force between the base substrate and the metal layer, and improve the performance of the display substrate. An arrangement of the gate insulating layer can realize a use function of the display substrate.

Figure 6:
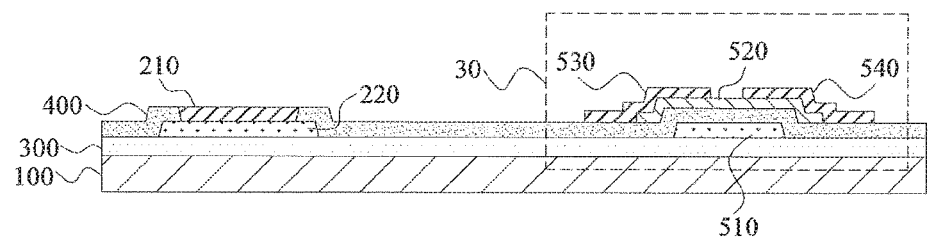
FIG. 6 is a structural diagram illustrating a display substrate according to yet another embodiment of the present disclosure.

According to an embodiment of the present disclosure, in order to save costs, the connection terminal is manufactured on the display substrate by using an existing manufacturing process. In this way, no new process is introduced, and the equipment and the cost are saved. According to an embodiment of the disclosure, the sacrificial metal is arranged on the base substrate; the first metal is arranged on a side of the sacrificial metal away from the base substrate; the sacrificial metal and a gate electrode of the thin film transistor are arranged in the same layer and made of the same material; the first metal and the source-drain electrode of the thin film transistor are arranged in the same layer and made of the same material, so that the sacrificial metal and the first metal can be manufactured by using the existing process, and the costs are saved. For example, referring to FIG. 6, the base substrate 100 includes a display region 30, the display region 30 is provided with a thin film transistor including a gate electrode 510, a source electrode 530, and a drain electrode 540; the sacrificial metal 220 and the gate electrode 510 are disposed in the same layer and made of the same material; the first metal 210 and the source-drain electrode are disposed in the same layer and made of the same material. Those skilled in the art can understand that the source-drain electrode of the thin film transistor includes the source electrode 530 and the drain electrode 540. According to an embodiment of the present disclosure, the first metal 210 and any one of the source electrode 530 and drain electrode 540 may be disposed in the same layer and made of the same material. According to a specific embodiment of the present disclosure, both the sacrificial metal and the gate electrode may be made of Mo, and the first metal, the source electrode and the drain electrode may be made of Ti/Al/Ti. Those skilled in the art can understand that the thin film transistor may further include an active layer 520, so as to realize a function of the thin film transistor.

Figure 7:
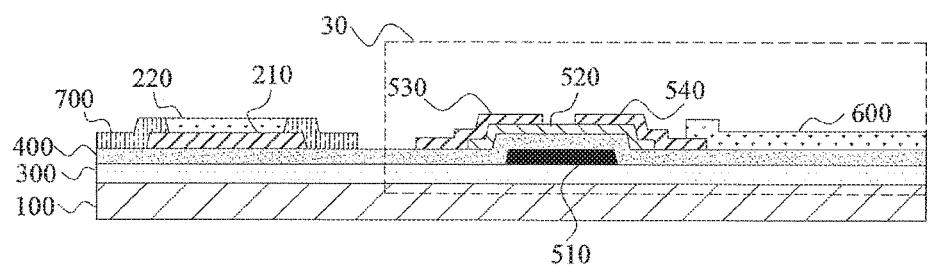
FIG. 7 is a structural diagram illustrating a display substrate according to further another embodiment of the present disclosure.

According to an embodiment of the disclosure, the first conductive layer is disposed on the base substrate; the second conductive layer is disposed on a side of the first conductive layer away from the base substrate; the second conductive layer and the pixel electrode are disposed in the same layer and made of the same material; and the first conductive layer is disposed in the same layer and made of the same material with the source electrode and the drain electrode of the thin film transistor. In this way, the first conductive layer and the second conductive layer can be manufactured by using the existing process, and the costs are saved. For example, referring to FIG. 7, the base substrate 100 includes a display region 30, the display region 30 is provided with a pixel electrode 600 and a thin film transistor including a source electrode 530 and a drain electrode 540; the second conductive layer 220 and the pixel electrode 600 are disposed in the same layer and made of the same material; and the first conductive layer 210 is disposed in the same layer and made of the same material with the source electrode 530 and the drain electrode 540. According to a specific embodiment of the present disclosure, both the second conductive layer and the pixel electrode may be made of ITO, and the first conductive layer, the source electrode and drain electrode each may be made of Ti/Al/Ti.

Figure 8:
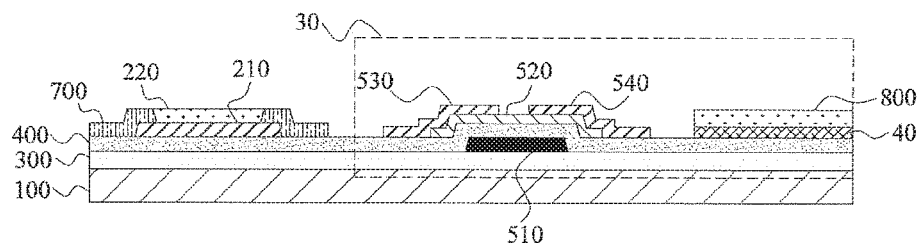
FIG. 8 is a structural diagram illustrating a display substrate according to still another embodiment of the present disclosure.

According to an embodiment of the present disclosure, the first conductive layer is disposed on the base substrate; the second conductive layer is disposed on a side of the first conductive layer away from the base substrate; the second conductive layer and a touch electrode are disposed in the same layer and made of the same material; and the first conductive layer is disposed in the same layer and made of the same material with the source electrode and the drain electrode of the thin film transistor, so that the second conductive layer and the first conductive layer can be manufactured by using the existing process, and the costs are saved. For example, referring to FIG. 8, the base substrate 100 includes a display region 30, the display region 30 is provided with a touch electrode 800 and a thin film transistor including a source electrode 530 and a drain electrode 540. The second conductive layer 220 and the touch electrode 800 are disposed in the same layer and made of the same material; and the first conductive layer 210 is disposed in the same layer and made of the same material with the source electrode 530 and the drain electrode 540. According to a specific embodiment of the present disclosure, both the second conductive layer and the touch electrode may be made of ITO; and the first conductive layer, the source electrode, and drain electrode each may be made of Ti/Al/Ti. Those skilled in the art can understand that the touch electrode may be arranged in multiple positions in the display substrate. In the case where the touch electrode is disposed in the display substrate, the second conductive layer according to the embodiment of the present disclosure may be disposed in the same layer and made of the same material with the touch electrode in the display substrate, thereby simplifying the manufacturing process. Those skilled in the art can understand that, in the case where the touch electrode is disposed in the display substrate, a planarization layer 40 may also be disposed on a side of the touch electrode 800 close to the gate insulating layer 400.

According to an embodiment of the present disclosure, when the second conductive layer and the pixel electrode are disposed in the same layer and made of the same material, or when the second conductive layer and the touch electrode are disposed in the same layer and made of the same material, an insulating layer 700 is disposed in the bonding region of the base substrate 100, and the insulating layer 700 is disposed on a side of the gate insulating layer 400 away from the buffer layer 300, thereby preventing from interference of external wirings. The insulating layer 700 may be manufactured in synchronization with the structure such as a passivation layer, a planarization layer and an interlayer insulating layer.

Another aspect of the present disclosure provides a display device. According to an embodiment of the present disclosure, the display device includes the above-described display substrate, and hence possesses all the features and advantages of the above-described display substrate which will not be repeated herein. Generally speaking, the display device achieves relatively higher display quality.

Figure 9:
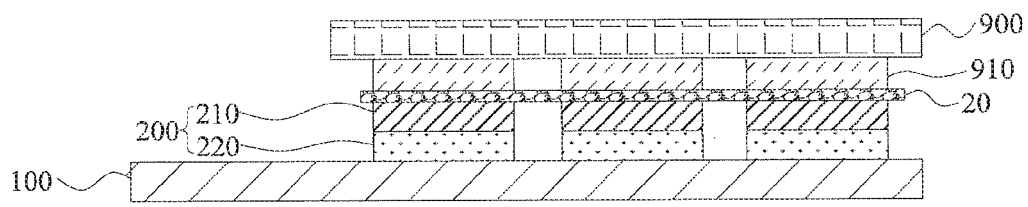
FIG. 9 is a structural diagram illustrating a display device according to an embodiment of the present disclosure.

According to an embodiment of the present disclosure, referring to FIG. 9, the display device may further include a flexible printed circuit board 900 having metal terminals 910 which are connected with the connection terminals 200 in one-to-one correspondence through the conductive film 20. Thus, signal transmission can be realized and the display function of the display device can be achieved.

Hereinafter, a bonding process of the flexible printed circuit board and the display substrate will be briefly described.

Figure 10:
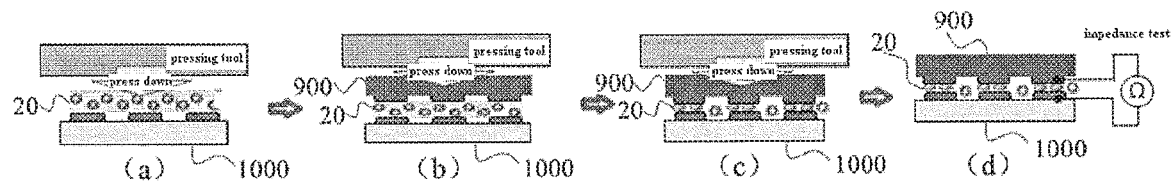
FIG. 10 illustrates a bonding process of a display device according to an embodiment of the present disclosure.

Referring to FIG. 10, a display substrate 1000 according to an embodiment of the present disclosure is provided firstly, and then a conductive film 20 is attached to a surface of the connection terminals on the display substrate 1000 by using a press tool (as shown in (a) of FIG. 10). Then, the metal terminals on the flexible printed circuit board 900 and the connection terminals on the display substrate 1000 are precisely aligned, for example, by using an industrial camera positioning (CCD) method. The industrial camera is equivalent to a magnifying glass which can magnify the connection terminals so as to complete a pre-bonding process (as shown in (b) of FIG. 10). Subsequently, the conductive film 20 is cured under high temperature and high pressure, and conductive spheres in the conductive film 20 are broken to achieve the connection between the connection terminals and the metal terminals, so as to complete a main bonding process (as shown in (c) of FIG. 10). Finally, the impedance between the flexible printed circuit board 900 and the display substrate 1000 is tested to detect a conduction state between the flexible printed circuit board 900 and the display substrate 1000, so as to ensure the realization of the use function of the final display device (as shown in (d) of FIG. 10). According to an embodiment of the present disclosure, the conductive film 20 may be an anisotropic conductive film, whereby the flexible printed circuit board and the display substrate can be connected together by utilizing the adhesiveness and anisotropic conduction characteristics of the anisotropic conductive film.

Yet another aspect of the present disclosure provides a manufacturing method of a display substrate. According to an embodiment of the present disclosure, the display substrate manufactured by the manufacturing method can be the above-described display substrate. Thus, the display substrate manufactured by the manufacturing method can have the same features and advantages as the above-described display substrate, which will not be repeated herein.

Figure 11:
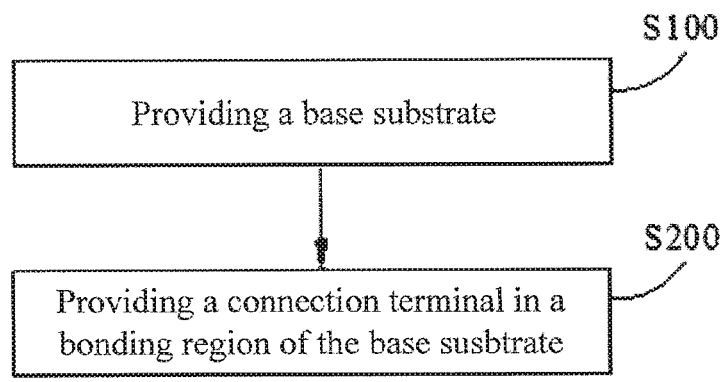
FIG. 11 is a flowchart illustrating a manufacturing method of a display substrate according to an embodiment of the present disclosure.

According to an embodiment of the present disclosure, referring to FIG. 11, the manufacturing method includes the steps as below.

S100: providing a base substrate.

According to an embodiment of the present disclosure, in this step, a base substrate is provided. According to an embodiment of the present disclosure, the base substrate includes a bonding region so that a connection terminal is provided in the bonding region in a subsequent process.

S200: providing a connection terminal in a bonding region on the base substrate.

According to an embodiment of the present disclosure, in this step, a connection terminal is provided in the bonding region of the base substrate. According to an embodiment of the present disclosure, the connection terminal includes a first metal and a sacrificial metal which are stacked one on another and in contact with each other. Herein, the first metal 210 is an example of a first conductive layer; and the sacrificial metal 220 is an example of the second conductive layer. A positional relationship between the first metal and the sacrificial metal has been described above in details and will not be repeated herein. For example, according to an embodiment of the present disclosure, the sacrificial metal is disposed on the base substrate, and the first metal is disposed on a side of the sacrificial metal away from the base substrate; in this way, when the first metal is scratched or burnt-out, a signal still can be transmitted through the sacrificial metal at a breakpoint. Alternatively, according to an embodiment of the present disclosure, the first metal is disposed on the base substrate, and the sacrificial metal is disposed on a side of the first metal away from the base substrate; in this way, the sacrificial metal can be used to protect the first metal from scratching or burning. A dimensional relationship between the first metal and the sacrificial metal in the above two cases has also been described in details as above and will not be repeated herein.

According to an embodiment of the present disclosure, in order to simplify the manufacturing process, the sacrificial metal and the first metal are manufactured by using the existing process, so that no new process is introduced and the manufacturing costs are saved. For example, according to an embodiment of the present disclosure, a display substrate includes a display region, the display region is provided with a thin film transistor, and the sacrificial metal and a gate electrode of the thin film transistor are synchronously disposed on the base substrate by using the same patterning process. On a side of the sacrificial metal away from the base substrate, the first metal and the source-drain electrode of the thin film transistor are synchronously disposed by the same patterning process. In this way, the sacrificial metal and the gate electrode can be synchronously formed by a process for manufacturing the gate electrode, and the first metal and the source-drain electrode can be synchronously formed by a process for manufacturing the source-drain electrode. Therefore, the sacrificial metal and the first metal can be manufactured by using the existing process, so that the manufacturing process is simplified, and the costs are saved.

According to an embodiment of the present disclosure, the base substrate includes a display region, the display region is provided with a pixel electrode and a thin film transistor. On the base substrate, a first conductive layer and a source-drain electrode of the thin film transistor are synchronously provided by using a same patterning process. On a side of the first conductive layer away from the base substrate, a second conductive layer and the pixel electrode are synchronously provided by using a same patterning process. In this way, the first conductive layer and the source-drain electrode can be synchronously formed by a process for manufacturing the source-drain electrode, and the second conductive layer and the pixel electrode can be synchronously formed by a process for manufacturing the pixel electrode. Therefore, the second conductive layer and the first conductive layer can be manufactured by using the existing process, so that the manufacturing process is simplified, and the costs are saved.

According to an embodiment of the disclosure, the base substrate includes a display region, the display region is provided with a touch electrode and a thin film transistor. On the base substrate, the first conductive layer and the source-drain electrode of the thin film transistor are synchronously provided by using a same patterning process. On a side of the first conductive layer away from the base substrate, a second conductive layer and the touch electrode are synchronously provided by a same patterning process. In this way, the first conductive layer and the source-drain electrode can be synchronously formed by a process for manufacturing the source-drain electrode, and the second conductive layer and the touch electrode can be synchronously formed by a process for manufacturing the touch electrode. Therefore, the second conductive layer and the first conductive layer can be manufactured by the existing process, the manufacturing process is simplified, the costs are saved, and the problem of poor conductivity of the display substrate with a touch function can be improved.

To sum up, by using the connection terminal having two conductive layers, and by forming the sacrificial metal and the first metal in the connection terminal by using the existing process, no new process is introduced, the manufacturing method is simplified, and the manufacturing costs are saved, so as to obtain a display substrate in which the signal conduction is guaranteed, thereby improving the production yield of the display substrate and the display quality of the display device employing the display substrate.

In the abovementioned embodiments of the present disclosure, the bonding region 10 and the display region 30 of the base substrate 100 are not overlapped with each other in a direction perpendicular to the base substrate 100.

Although only the case where the first conductive layer 210 includes three sub-conductive layers has been described in the abovementioned embodiments, the second conductive layer may also include a plurality of sub-conductive layers in other embodiments. For example, in an example, the second conductive layer may further include a second sub-conductive layer which is disposed in the same layer and made of the same material as the touch electrode, in addition to a first sub-conductive layer which is disposed in the same layer and made of the same material as the pixel electrode. The first sub-conductive layer and the second sub-conductive layer are in direct contact with each other, and are overlapped with each other in a direction perpendicular to the base substrate.

In the description of the present disclosure, orientation or positional relationship indicated by the terms "above", "below" and the like is based on the orientation or positional relationship shown in the drawings, is only for convenience of description of the present disclosure and not for requiring the present disclosure to be constructed and operated in a specific orientation, and thus cannot be understood as a limitation of the present disclosure.

In the description of this specification, the description referring to the terms "an embodiment", "another embodiment" and the like means that the specific features, structures, materials, or characteristics described in connection with the embodiment is included in at least one embodiment of the present disclosure. In this specification, the schematic representation of the above-mentioned terms does not necessarily refer to the same embodiment or example. Furthermore, the specific features, structures, materials, or characteristics as described may be combined in any one or more embodiment or example in a suitable manner. Moreover, those skilled in the art can combine and integrate different embodiments or examples described in this specification and features of different embodiments or examples without contradicting each other. Additionally, it should be noted that in this specification, the terms "first" and "second" are used for descriptive purposes only and cannot be understood as indicating or implying relative importance or implicitly indicating the number of technical features indicated.

Although embodiments of the present disclosure have been shown and described above, it is to be understood that the above-mentioned embodiments are exemplary and should not be construed as limiting the present disclosure, and those of ordinary skill in the art may make changes, modifications, substitutions and variations to the above-mentioned embodiments within the scope of the present disclosure.

What is claimed is:

1. A display substrate, comprising:
    a base substrate, comprising a bonding region; and
    a connection terminal located in the bonding region of the base substrate, the connection terminal comprising a first conductive layer and a second conductive layer being in contact with each other, wherein
    the first conductive layer and the second conductive layer are overlapped with each other in a direction perpendicular to the base substrate, wherein
    the base substrate further comprises a display region which is not overlapped with the bonding region, a thin film transistor and a pixel electrode are located in the display region,
    the first conductive layer is electrically connected with the thin film transistor, and
    the second conductive layer is electrically connected only with the first conductive layer.

2. The display substrate according to claim 1, wherein an orthographic projection of the first conductive layer on the base substrate and an orthographic projection of the second conductive layer on the base substrate are different in at least one of shape and size.

3. The display substrate according to claim 1, wherein the first conductive layer is located on a side of the second conductive layer away from the base substrate,
    an orthographic projection of the first conductive layer on the base substrate is smaller than an orthographic projection of the second conductive layer on the base substrate, and
    the orthographic projection of the first conductive layer on the base substrate is completely located within the orthographic projection of the second conductive layer on the base substrate.

4. The display substrate according to claim 1, wherein
    the thin film transistor comprises a gate electrode and a source-drain electrode.

5. The display substrate according to claim 4, wherein the second conductive layer and the gate electrode are located in a same layer and made of a same material, and
    the first conductive layer and the source-drain electrode are located in a same layer and made of a same material.

6. The display substrate according to claim 4, wherein the second conductive layer and the pixel electrode are located in a same layer and made of a same material, and
    the first conductive layer and the source-drain electrode are located in a same layer and made of a same material.

7. The display substrate according to claim 4, further comprising a touch electrode, wherein the second conductive layer and the touch electrode are located in a same layer and made of a same material, and the first conductive layer and the source-drain electrode are located in a same layer and made of a same material.

8. The display substrate according to claim 1, wherein at least one of the first conductive layer and the second conductive layer comprises a plurality of sub-conductive layers.

9. The display substrate according to claim 8, wherein the first conductive layer comprises a stacked layer of Ti/Al/Ti, and
the second conductive layer comprises at least one of molybdenum and indium tin oxide.

10. The display substrate according to claim 1, wherein the connection terminal is configured to be electrically connected with a circuit board.

11. A display device, comprising:
the display substrate according to claim 1;
a circuit board comprising a metal terminal; and
a conductive film connecting the metal terminal and the connection terminal.

12. A manufacturing method of the display substrate according to claim 1, comprising:
providing the base substrate; and
providing the connection terminal in the bonding region of the base substrate.

13. The manufacturing method according to claim 12, wherein
the thin film transistor comprises a gate electrode and a source-drain electrode.

14. The manufacturing method according to claim 13, wherein providing the connection terminal in the bonding region of the base substrate comprises:
synchronously providing the second conductive layer and the gate electrode of the thin film transistor on the base substrate by using a first patterning process; and
synchronously providing the first conductive layer and the source-drain electrode of the thin film transistor on a side of the second conductive layer away from the base substrate by using a second patterning process.

15. The manufacturing method according to claim 13, wherein providing the connection terminal in the bonding region of the base substrate comprises:
synchronously providing the first conductive layer and the source-drain electrode of the thin film transistor on the base substrate by using a second patterning process; and
synchronously providing the second conductive layer and the gate electrode of the thin film transistor on a side of the first conductive layer away from the base substrate by using a first patterning process.

16. The manufacturing method according to claim 13, wherein the display substrate further comprises a touch electrode located on the base substrate,
providing the connection terminal in the bonding region of the base substrate comprises:
synchronously providing the first conductive layer and the source-drain electrode of the thin film transistor on the base substrate by using a second patterning process; and
synchronously providing the second conductive layer and the touch electrode on a side of the first conductive layer away from the base substrate by using a first patterning process.

* * * * *